(12) United States Patent
Yang

(10) Patent No.: US 8,815,333 B2
(45) Date of Patent: Aug. 26, 2014

(54) MANUFACTURING METHOD OF METAL STRUCTURE IN MULTI-LAYER SUBSTRATE

(75) Inventor: Chih-kuang Yang, Hsin-Chu (TW)

(73) Assignee: Princo Middle East FZE, Jebel, Ali, Dubai (AE)

( * ) Notice: Subject to any disclaimer, the term of this patent is extended or adjusted under 35 U.S.C. 154(b) by 176 days.

(21) Appl. No.: 13/447,326

(22) Filed: Apr. 16, 2012

(65) Prior Publication Data

US 2012/0202159 A1 Aug. 9, 2012

Related U.S. Application Data

(63) Continuation-in-part of application No. 11/951,057, filed on Dec. 5, 2007, now abandoned.

(51) Int. Cl.
| | |
|---|---|
| *B05D 5/12* | (2006.01) |
| *C23C 18/16* | (2006.01) |
| *C23C 18/31* | (2006.01) |
| *H05K 3/24* | (2006.01) |
| *H01L 21/288* | (2006.01) |
| *G03F 7/09* | (2006.01) |

(52) U.S. Cl.
CPC .............. *B05D 5/12* (2013.01); *C23C 18/1603* (2013.01); *C23C 18/1605* (2013.01); *C23C 18/31* (2013.01); *H05K 3/244* (2013.01); *H01L 21/288* (2013.01); *G03F 7/091* (2013.01)
USPC ....... 427/97.7; 427/96.2; 427/97.3; 427/98.4; 427/98.5; 427/282

(58) Field of Classification Search
CPC .. B05D 1/32; C23C 18/1603; C23C 18/1605; C23C 18/31; H05K 3/244; H01L 21/288; G03F 7/091
USPC ............. 430/325; 427/96.2, 97.1, 97.3, 98.4, 427/98.5, 282
See application file for complete search history.

(56) References Cited

U.S. PATENT DOCUMENTS

| | | | |
|---|---|---|---|
| 3,057,952 A | 10/1962 | Gordon | |
| 3,168,617 A | 2/1965 | Richter | |
| 3,215,574 A | 11/1965 | Korb | |
| 4,085,502 A | 4/1978 | Ostman et al. | |
| 4,493,856 A | 1/1985 | Kumar | |
| 4,863,808 A | 9/1989 | Sallo | |

(Continued)

FOREIGN PATENT DOCUMENTS

| | | |
|---|---|---|
| CN | 1461181 | 12/2003 |
| CN | 1494120 | 5/2004 |

(Continued)

*Primary Examiner* — Brian K Talbot

(57) ABSTRACT

Disclosed is a manufacturing method of metal structure in multi-layer substrate. The manufacturing method includes following steps: coating at least one photoresist layer on a surface of a dielectric layer; exposing the photoresist dielectric layer to define a predetermined position of the metal structure; removing the photoresist layer at the predetermined position to undercut an edge of the photoresist layer adjacent to the predetermined position by a horizontal distance of at least 0.1 μm between a top and a bottom of the edge; forming the metal structure at the predetermined position; and forming at least one top-cover metal layer to cover a top surface and two side surfaces of the metal structure. The present invention can form a cover metal layer covering the top surface and the two side surfaces by one single photomask.

21 Claims, 10 Drawing Sheets

(56) References Cited

U.S. PATENT DOCUMENTS

| | | |
|---|---|---|
| 5,158,657 A | 10/1992 | Kadokura |
| 5,213,840 A | 5/1993 | Retallick et al. |
| 5,246,564 A | 9/1993 | Tamiya et al. |
| 5,281,765 A | 1/1994 | Iura |
| 5,458,763 A | 10/1995 | Kobayashi |
| 5,483,021 A | 1/1996 | Saen et al. |
| 5,485,352 A | 1/1996 | Shibuya et al. |
| 5,527,997 A | 6/1996 | Saen et al. |
| 5,666,717 A | 9/1997 | Matsumoto |
| 6,100,582 A | 8/2000 | Omote |
| 6,198,284 B1 | 3/2001 | Doty |
| 6,426,143 B1 | 7/2002 | Voss et al. |
| 6,518,503 B1 | 2/2003 | Yamanobe et al. |
| 6,633,045 B1 | 10/2003 | Sugihara |
| 7,087,438 B2 * | 8/2006 | Kasko et al. .................. 438/3 |
| 7,169,653 B2 * | 1/2007 | Lee et al. .................. 438/149 |
| 7,626,125 B2 * | 12/2009 | Nakamura .................. 174/257 |
| 8,110,748 B2 * | 2/2012 | Nakamura .................. 174/257 |
| 8,546,048 B2 * | 10/2013 | Riege .................. 430/5 |
| 2003/0022109 A1 * | 1/2003 | Kobayashi .................. 430/311 |
| 2004/0152241 A1 | 8/2004 | Usui et al. |
| 2005/0104218 A1 | 5/2005 | Tonami |
| 2005/0179129 A1 | 8/2005 | Sasaki |
| 2005/0221232 A1 | 10/2005 | Baldwin et al. |
| 2006/0009020 A1 * | 1/2006 | Tanaka .................. 438/597 |

FOREIGN PATENT DOCUMENTS

| | | |
|---|---|---|
| CN | 1505123 | 6/2004 |
| CN | 2741319 | 11/2005 |
| CN | 1744799 | 3/2006 |
| CN | 1940599 | 4/2007 |
| CN | 1957298 | 5/2007 |
| DE | 2445779 | 4/1975 |
| EP | 0089604 | 9/1983 |
| EP | 0215557 | 3/1987 |
| EP | 1005073 | 5/2000 |
| JP | 1-205495 | 8/1989 |
| JP | 03-229484 | 10/1991 |
| JP | 2000-340901 | 12/2000 |
| JP | 2005-317836 | 11/2005 |
| JP | 2009033084 | 2/2009 |
| WO | 2006/134399 | 12/2006 |
| WO | 2006134399 | 12/2006 |
| WO | 2007/037553 | 4/2007 |

\* cited by examiner

MANUFACTURING METHOD OF METAL STRUCTURE IN MULTI-LAYER SUBSTRATE

CROSS REFERENCE TO RELATED APPLICATION

This is a continuation-in-part of a U.S. patent application Ser. No. 11/951,057, filed on Dec. 5, 2007.

BACKGROUND OF THE INVENTION

1. Field of the Invention

The present invention generally relates to a method for manufacturing a metal structure in a multi-layer substrate, and more particularly to a method for manufacturing metal structures in a flexible multi-layer substrate.

2. Description of Prior Art

Miniaturization for all electronic productions is an unavoidable trend in this modern world. While the scales of the semiconductor chips continuously get smaller, the scale of the related technology for packaging needs to be micro-miniaturized to follow the scale of the semiconductor chip is also unavoidable. Today, because the integration of integrated circuits has been greatly increased, using a multi-layer substrate to package different kinds of chip devices is necessary to obtain a high performance integration system consequently. In the package technology industry, an etching method or build up process is a currently a commonly used method to manufacture a metal structure in a multi-layer substrate. Meanwhile, the higher the integration of semiconductor chip becomes, the higher the demand for finer metal structure.

Please refer to FIG. 1, which depicts a diagram of manufacturing a metal structure by an etching method according to the prior art. A metal layer is formed on a dielectric layer 100 of a multi-layer substrate. After a photoresist layer 104 is coated and exposed, the metal structures 102 are formed by an etching method. Generally, the metal structures 102 are formed by wet etching according to prior art. The side surfaces of the metal structures 102 are etched and undercuts happens thereto as shown in FIG. 1 because the isotropic character of the wet etching skill. Besides, the side surfaces become rough because of grain size of metal, especially of copper. With the increasing demand for finer metal structure brought by higher integration of semiconductor chips, an etching method now no longer can satisfy the needs for finer metal structure because of its drawbacks of the undercut and the roughness of the side surface.

Generally, copper can be used as the material of the metal structure when a multi-layer substrate is manufactured. It is easy to be corroded, especially when the polyimide is used to manufacture the dielectric layer. If a protective cover metal layer is desired to cover the metal structure's surface to prevent corrosion from other materials of the multi-layer substrate and to raise reliability of the metal structure, additional exposing and etching processes for forming the cover metal layers to cover the metal structure will be necessary according to the traditional etching method. The yield in manufacturing the multi-layer substrate is potentially decreased, due to issue of the positioning accuracy of the metal structure and the cover metal layer. Meanwhile, cost is also increased. Furthermore, the cover metal layer of covering the top surface, two side surfaces, even the under surface of the metal structure cannot be formed by one single photomask according to the etching method, i.e. the etching method cannot form the cover metal layer covering the metal structure completely to raise the reliability of the metal structure. The etching method cannot realize a metal structure as being a coaxial structure, either.

Please refer to FIG. 2A to FIG. 2D, which depict diagrams of manufacturing a metal structure by build up process according to the prior art. FIG. 2A shows a step of forming a very thin metal layer (seed layer) 102 on a dielectric layer 100 of the multi-layer substrate. FIG. 2B shows a step of forming a metal layer at the predetermined position (such as Electroplating) after coating a photoresist layer 104 except the predetermined position. FIG. 2C shows a step of removing the photoresist layer 104, and then the dielectric layer 100 and the metal layer 102 are left. FIG. 2D shows a step of etching the metal layer 102 to remove the metal material outside the predetermined position. However, the side surfaces of the metal structures 102 are etched as shown in FIG. 2 because the isotropic character of the wet etching process. Besides, because of the limitation of the size of the metal grain, the side surfaces of the metal structures become rough after the etching process.

Because of the limitation came of the size of the metal grain, either the etching method or the build up process cannot prevent the metal structure side surfaces from becoming rough. Such drawback can be a fatal restriction to the demand for finer metal structure. Furthermore, either the etching method or the build up process cannot form the cover metal layer of covering the top surface, two side surfaces, even the under surface of the metal structure completely by one single photomask to raise the reliability of the metal structure.

Therefore, there is a need to develop a method for manufacturing a metal structure in a multi-layer substrate and the structure thereof, so as to form the cover metal layer of covering the top surface, two side surfaces, even the under surface of the metal structure completely by one single photomask. The metal structure can be finer and with higher reliability and can be a coaxial structure.

SUMMARY OF THE INVENTION

An objective of the present invention is to provide a method for manufacturing a metal structure in a multi-layer substrate to form a cover metal layer covering the top surface and the two side surfaces, even the under surface of the metal structure by one single photomask.

Another objective of the present invention is to provide a method for manufacturing metal structures in a multi-layer substrate, so as to prevent the metal structure from corrosion or contamination caused by other materials of the multi-layer substrate and to manufacture a finer metal structure with higher reliability.

Briefly summarized, the manufacturing method according to an aspect of the present invention comprises the follow steps:

coating at least one photoresist layer on a surface of a dielectric layer;

exposing the photoresist layer to define a predetermined position of the metal structure;

removing the photoresist layer at the predetermined position (such as developing process) to undercut an edge of the photoresist layer adjacent to the predetermined position by a horizontal distance of at least 0.1 µm between a top and a bottom of the edge;

forming the metal structure at the predetermined position; and forming at least one top-cover metal layer to cover a top surface and two side surfaces of the metal structure.

Before the step of forming the metal structure, the manufacturing method of the present invention may comprise a step of forming an under-cover metal layer at the predetermined position to cover the under surface of the metal structure. After the step of forming the under-cover metal layer, the manufacturing method of the present invention may comprise a step of forming an under-cover dielectric layer on the under-cover metal layer. Moreover, the manufacturing method of the present invention comprises a step of forming a top-cover dielectric layer on the surface of the metal layer before the step of forming the top-cover metal layer. Accordingly, the metal structure, the top-cover, under-cover dielectric layers, the top-cover metal layer and the under-cover metal layer can be employed as a coaxial structure.

The manufacturing method according to another aspect of the present invention comprises the follow steps:

coating at least one photoresist layer on a surface of a dielectric layer;

exposing the photoresist layer to define a predetermined position of the metal structure;

removing the photoresist layer at the predetermined position to undercut an edge of the photoresist layer adjacent to the predetermined position by a horizontal distance of at least 0.1 µm between a top and a bottom of the edge;

forming the metal structure at the predetermined position; and forming at least one top-cover dielectric layer to cover a top surface and two side surfaces of the metal structure.

According to the manufacturing method of the present invention, forming a cover metal layer covering the top surface and the two side surfaces, even the under surface of the metal structure by one single photomask becomes possible. Unlike etching or build up process according to prior arts, the manufacturing method of the present invention prevents the side surfaces of the metal structure from etching which satisfies the demand for the finer metal structure nowadays. Moreover, the top-cover metal layer and the under-cover metal layer are formed to prevent the metal structure from corrosion or contamination, so as to raise the reliability of the metal structure. Meanwhile, being a coaxial structure can also be realized. Therefore, the present invention can greatly increase the integration of the metal structures in the multi-layer substrate. The manufacturing method of the present invention can also be applied for a deformable or flexible substrate.

DETAILED DESCRIPTION OF THE INVENTION

Figure 1:
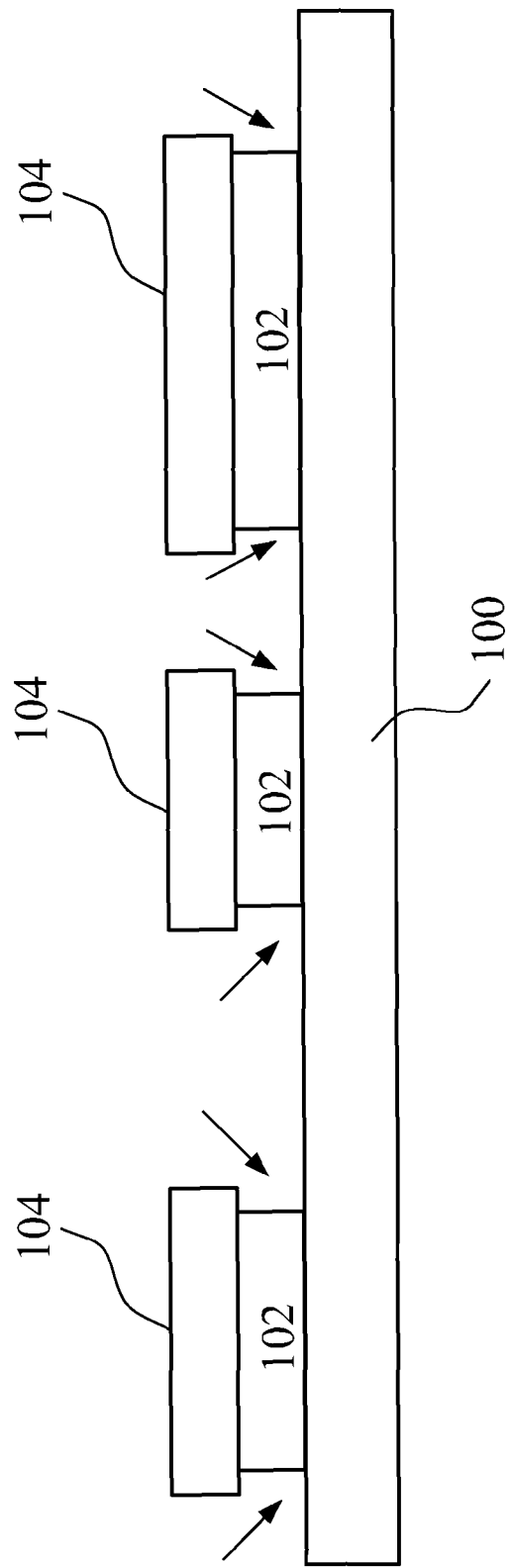
FIG. 1 depicts a diagram of manufacturing a metal structure by etching according to the prior art.
Figure 2A:
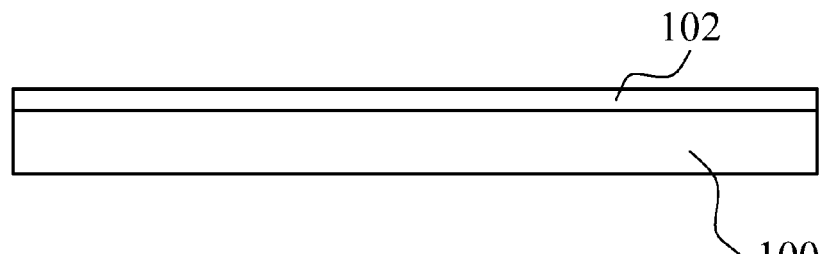
FIG. 2A to FIG. 2D depict diagrams of manufacturing a metal structure by build up process according to the prior art.
Figure 2B:
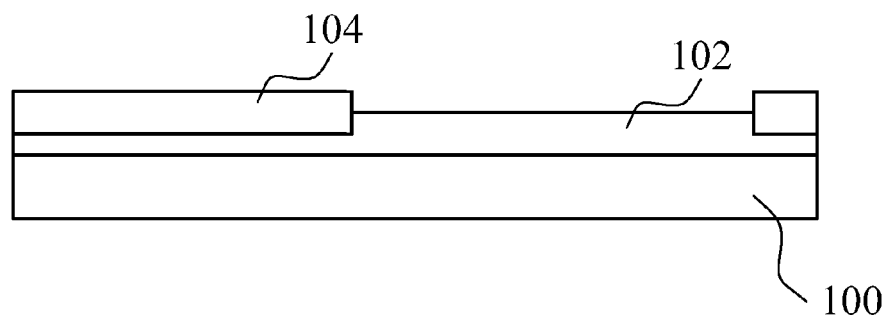
Figure 2C:
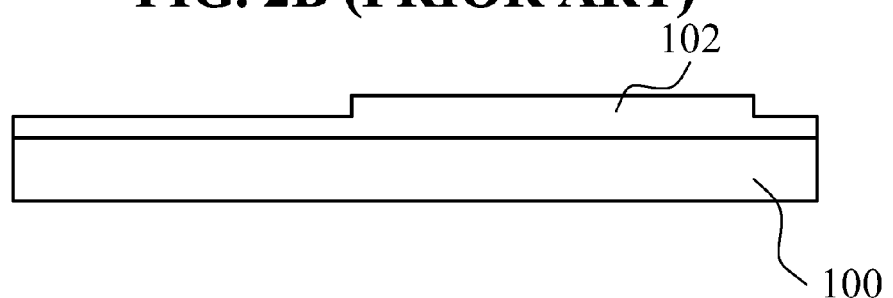
Figure 2D:
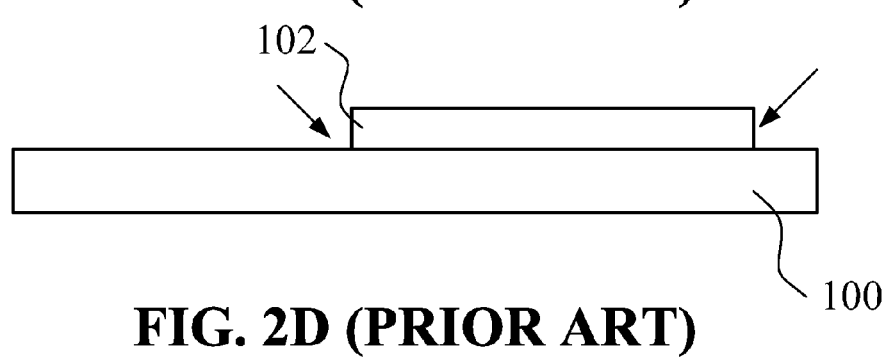
Figure 3A:
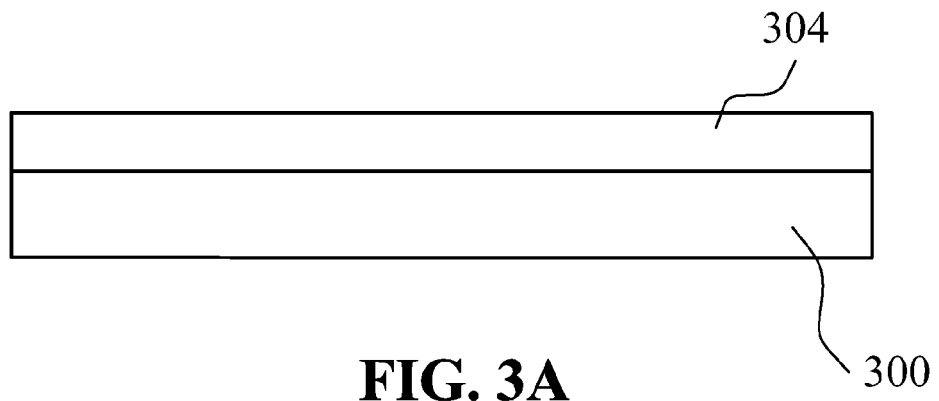
FIG. 3A to FIG. 3E depict a structural flow chart of a manufacturing method of a metal structure in a multi-layer substrate according to the first embodiment of the present invention.
Figure 3B:
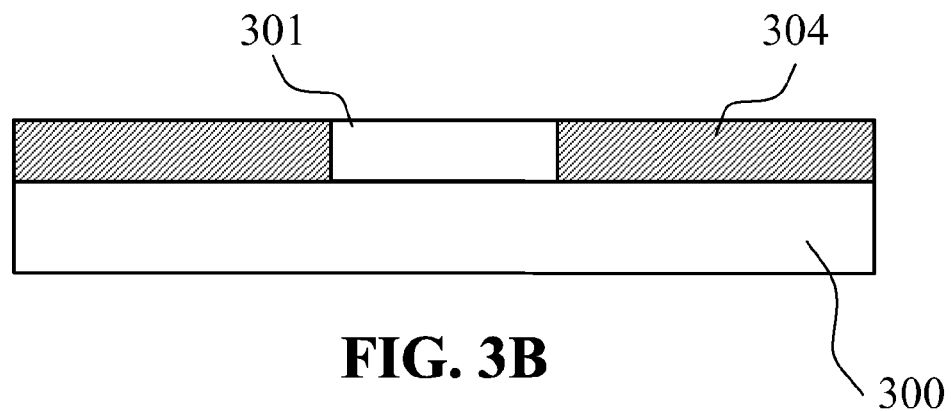
Figure 3C:
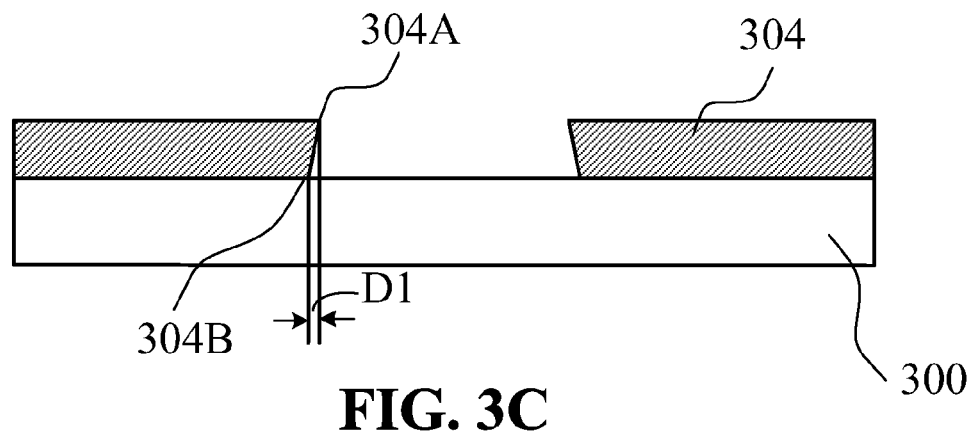

Please refer to FIG. 3A to FIG. 3E, which depict a structural flow chart of a manufacturing method of a metal structure in a multi-layer substrate according to the first embodiment of the present invention. FIG. 3A shows a step of coating a photoresist layer 304 on a surface of a dielectric layer 300. FIG. 3B shows a step of exposing the photoresist layer 304 except the photoresist layer 301 at a predetermined position of the metal structure after coating a photoresist layer 304. FIG. 3C shows a step of removing the photoresist layer 301 at the predetermined position (such as developing process). In this embodiment, the negative type photoresist layer is employed. The photoresist layer 301 is removed by the developer, so as to undercut an edge of the photoresist layer 304 adjacent to the predetermined position by a horizontal distance D1 of at least approximately 0.1 µm between a top 304A and a bottom 304B of the edge and more preferably by a horizontal distance D1 within 0.3 µm and 1 µm. That is, the photoresist layer 304 is undercutted at the position of the bottom 304B of the edge as shown in FIG. 3C. The reason why the edge of the photoresist layer 304 adjacent to the predetermined position is required to be undercutted will be described later. By controlling the top 304A of the edge of the photoresist layer 304 to receive more light than the bottom 304B of the edge of the photoresist layer 304, the edge of the photoresist layer 304 adjacent to the predetermined position can be undercutted by the horizontal distance D1 of at least approximately 0.1 µm between the top 304A and the bottom 304B of the edge, i.e. the top 304A of the edge can protrude over the bottom 304B of edge by the horizontal distance D1 of at least approximately 0.1 µm and more preferably by the horizontal distance D1 within 0.3 µm and 1 µm. However, the present invention is not limited with the negative type photoresist layer. Employing two photoresist layers can also be considered, such as, using the two positive type photoresist layers has different development rates. Then, the photoresist layers at the predetermined position are exposed. When the photoresist layers at the predetermined position are removed by the developer, the edges of the photoresist layers adjacent to the predetermined position can also be undercutted because there is difference between the development rates of the top photoresist layer and the bottom photoresist layer.

Figure 3D:
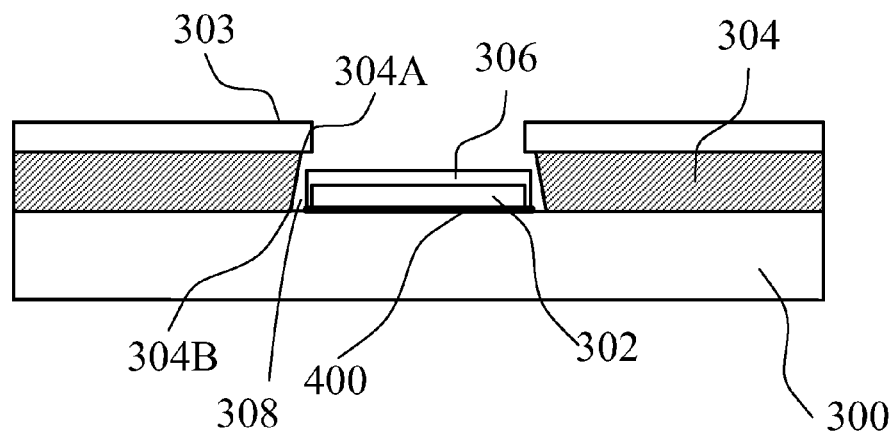

FIG. 3D shows steps of forming the metal structure 302 at the predetermined position (also forming a metal layer 303 on the photoresist layer 304) and forming a top-cover metal layer 306 on the surface of the metal structure 302 to protect the metal structure 302. More particularly, the top-cover metal layer 306 is formed to cover a top surface and two side surfaces of the metal structure 302. In one preferred embodiment, the top-cover metal layer 306 is formed by a vacuum coating at a pressure of at least approximately $1 \times 10^{-8}$ mbar and more preferably at a pressure of at least $5 \times 10^{-7}$ mbar. Furthermore, since the edge of the photoresist layer 304 adjacent to the predetermined position is undercutted, atoms of material, which is used for forming the top-cover metal layer 306, collide the surface between the top 304A and the bottom 304B of the edge and then rebound to the corresponding side surface of the metal structure 302 during the process of forming the top-cover metal layer 306, such that the top-cover metal layer 306 can be formed on the corresponding side surface of the metal structure 302. If the edge of the photoresist layer 304 adjacent to the predetermined position is not undercutted, that is, the surface between the top 304A and the bottom 304B of the edge is perpendicular to the horizontal surface, the atoms of the material used for forming the top-cover metal layer 306 collide the surface between the top 304A and the bottom 304B but does not rebound to the corresponding side surface of the metal structure 302 during the process of forming the top-cover metal layer 306. As a result, the top-cover metal layer 306 cannot be formed on the corresponding side surface of the metal structure 302.

In conclusion, the condition that the edge of the photoresist layer 304 adjacent to the predetermined position is undercutted by the horizontal distance D1 of at least 0.1 μm between the top 304A and the bottom 304B of the edge and more preferably by the horizontal distance D1 within 0.3 μm and 1 μm is required for forming the top-cover layer 306 on the two side surfaces of the metal structure 302.

Moreover, when the top-cover metal layer 306 is formed by a vacuum coating at a pressure of at least $1 \times 10^{-8}$ mbar and more preferably at a pressure of at least $5 \times 10^{-7}$ mbar, significantly, the gas atoms collide the surface between the top 304A and the bottom 304B of the edge and collide with one another, either. As a result, a distribution density of the gas atoms in a space 308 can be higher during the process of the vacuum coating. Ultimately, the gas atoms collide and then rebound to the corresponding side surface of the metal structure 302. The top-cover metal layer to cover 306 the two side surfaces of the metal structure 302 can be formed, and the significant feature of the present invention, which is to form the top-cover metal layer 306 on the top and the two side surfaces of the metal structure 302 in one single process, can be realized.

Figure 3E:
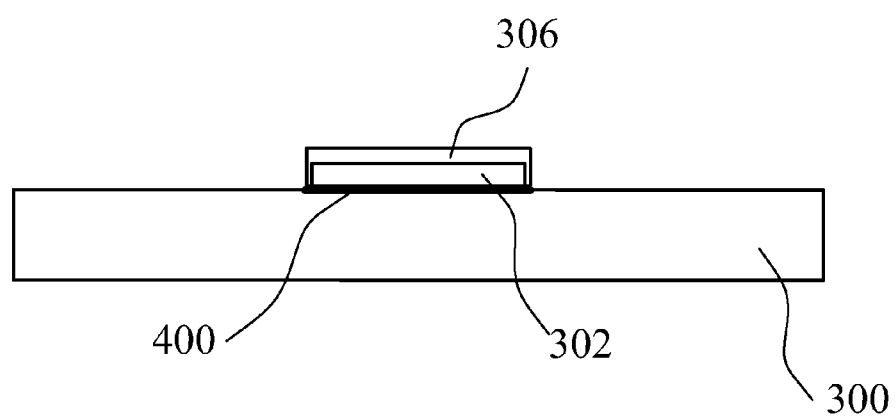

FIG. 3E shows a step of removing the metal layer 303 and the photoresist layer 304 for the processes thereafter.

As shown in FIG. 3D, before the step of forming the metal structure 302, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the metal structure 302.

Figure 4A:
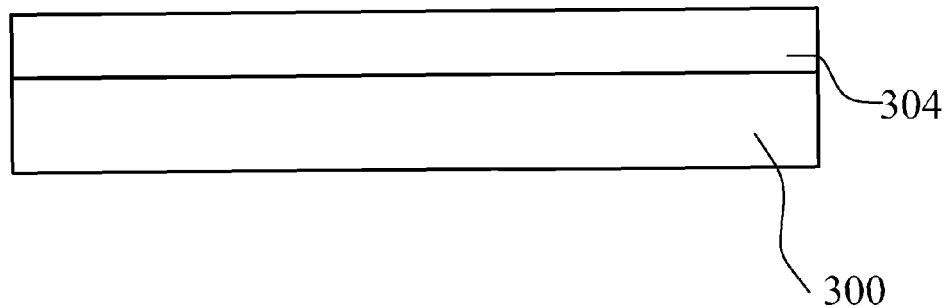
FIG. 4A to FIG. 4F depict a structural flow chart of a manufacturing method of a metal structure in a multi-layer substrate according to the second embodiment of the present invention.
Figure 4B:
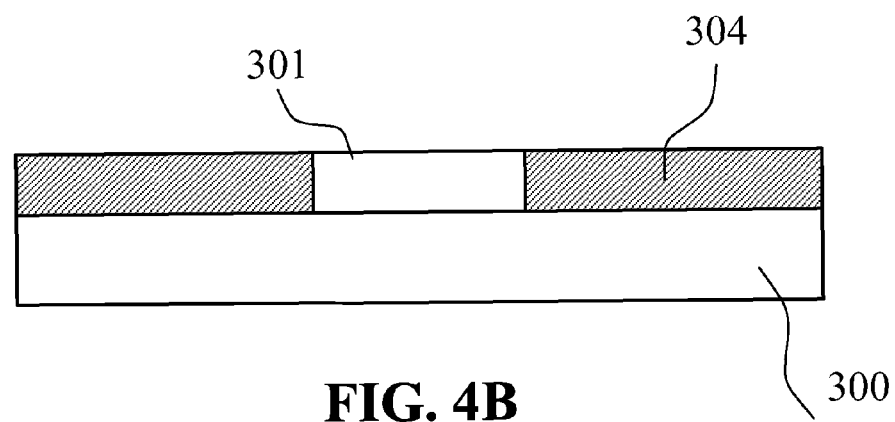
Figure 4C:
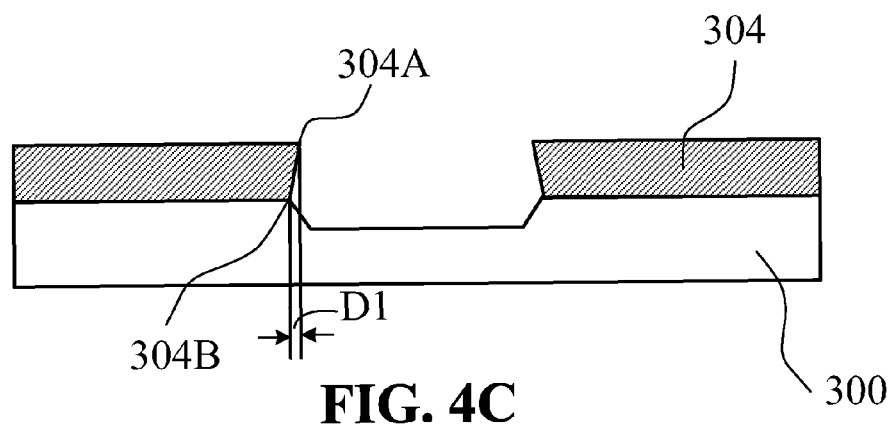

Please refer to FIG. 4A to FIG. 4F, which depict a structural flow chart of a manufacturing method of a metal structure in a multi-layer substrate according to the second embodiment of the present invention. FIG. 4A shows a step of coating a photoresist layer 304 on a surface of a dielectric layer 300. FIG. 4B shows a step of exposing the photoresist layer 304 except the photoresist layer 301 at a predetermined position of the metal structure after coating a photoresist layer 304. FIG. 4C shows steps of removing the photoresist layer 301 at the predetermined position, and then etching a certain depth of the dielectric layer 300 at the predetermined position. In this embodiment, the negative type photoresist layer is employed. The photoresist layer 301 is removed by the developer, so as to undercut an edge of the photoresist layer 304 adjacent to the predetermined position by a horizontal distance D1 of at least approximately 0.1 μm between a top 304A and a bottom 304B of the edge and more preferably by a horizontal distance D1 within 0.3 μm and 1 μm. That is, the photoresist layer 304 is undercutted at the position of the bottom 304B of the edge as shown in FIG. 4C. The reason why the edge of the photoresist layer 304 adjacent to the predetermined position is required to be undercutted is as above-mentioned and omitted herein. By controlling the top 304A of edge of the photoresist layer 304 to receive more light than the bottom 304B of the edge of the photoresist layer 304, the edge of the photoresist layer 304 adjacent to the predetermined position can be undercutted by the horizontal distance D1 of at least approximately 0.1 μm between the top 304A and the bottom 304B of the edge, i.e. the top 304A of the edge can protrude over the bottom 304B of edge by the horizontal distance D1 of at least approximately 0.1 μm and more preferably by the horizontal distance D1 within 0.3 μm and 1 μm. However, the present invention is not limited with the negative type photoresist layer. Employing two photoresist layers can also be considered to obtain the same shape.

Figure 4D:
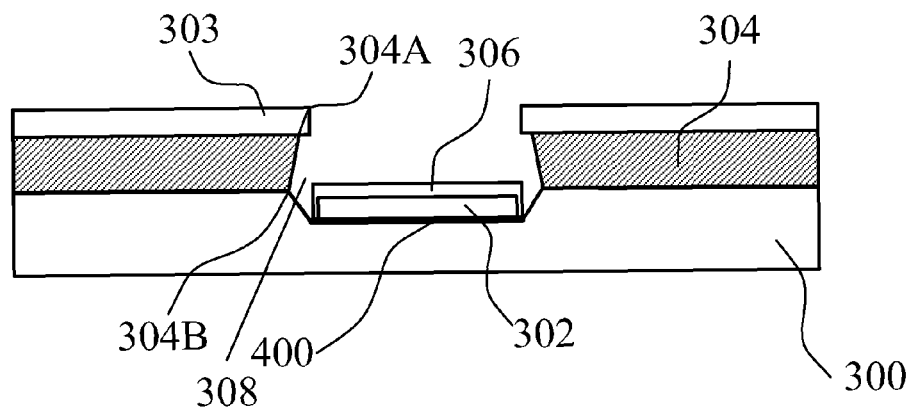

FIG. 4D shows steps of forming the metal structure 302 at the predetermined position (also forming a metal layer 303 on the photoresist layer 304) and forming a top-cover metal layer 306 on the surface of the metal structure 302 to protect the metal structure 302. More particularly, the top-cover metal layer 306 is formed to cover a top surface and two side surfaces of the metal structure 302. In one preferred embodiment, the top-cover metal layer 306 is formed by a vacuum coating at a pressure of at least approximately $1 \times 10^{-8}$ mbar and more preferably at a pressure of at least $5 \times 10^{-7}$ mbar. Furthermore, since the edge of the photoresist layer 304 adjacent to the predetermined position is undercutted, atoms of material, which is used for forming the top-cover metal layer 306, collide the surface between the top 304A and the bottom 304B of the edge and then rebound to the corresponding side surface of the metal structure 302 during the process of forming the top-cover metal layer 306, such that the top-cover metal layer 306 can be formed on the corresponding side surface of the metal structure 302. If the edge of the photoresist layer 304 adjacent to the predetermined position is not undercutted, that is, the surface between the top 304A and the bottom 304B of the edge is perpendicular to the horizontal surface, the atoms of the material used for forming the top-cover metal layer 306 collide the surface between the top 304A and the bottom 304B but does not rebound to the corresponding side surface of the metal structure 302 during the process of forming the top-cover metal layer 306. As a result, the top-cover metal layer 306 cannot be formed on the corresponding side surface of the metal structure 302.

The same as the first embodiment shown in FIG. 3A to FIG. 3E, the condition that the edge of the photoresist layer 304 adjacent to the predetermined position is undercutted by the horizontal distance D1 of at least 0.1 μm between the top 304A and the bottom 304B of the edge and more preferably by the horizontal distance D1 within 0.3 μm and 1 μm is required for forming the top-cover layer 306 on the two side surfaces of the metal structure 302.

Moreover, when the top-cover metal layer 306 is formed by a vacuum coating at a pressure of at least $1 \times 10^{-8}$ mbar and more preferably at a pressure of at least $5 \times 10^{-7}$ mbar, significantly, the gas atoms collide the surface between the top 304A and the bottom 304B of the edge and collide with one another, either. As a result, a distribution density of the gas atoms in a space 308 can be higher during the process of the vacuum coating. Ultimately, the gas atoms collide and then rebound to the corresponding side surface of the metal structure 302. The top-cover metal layer to cover 306 the two side surfaces of the metal structure 302 can be formed, and the significant feature of the present invention, which is to form the top-cover metal layer 306 on the top and the two side surfaces of the metal structure 302 in one single process, can be realized.

Figure 4E:
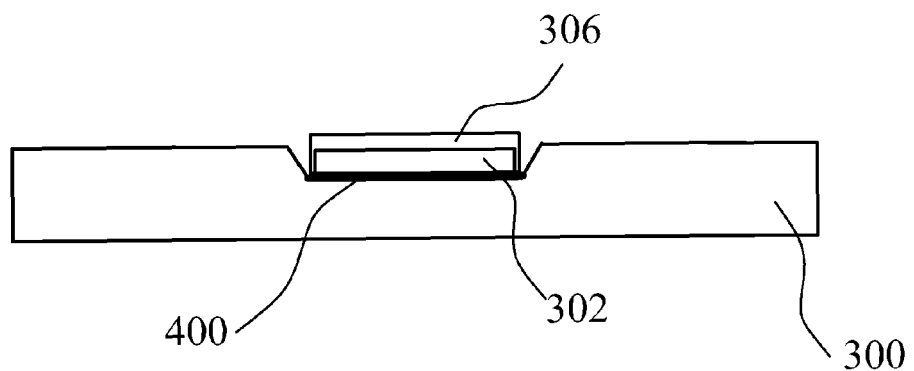
Figure 4F:
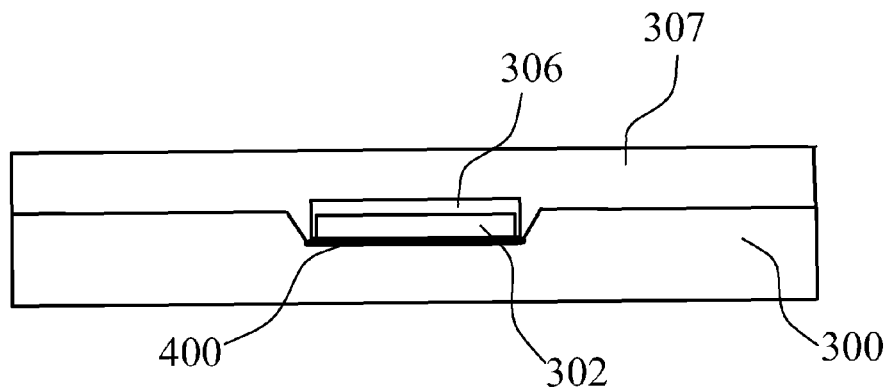

FIG. 4E shows a step of removing the metal layer 303 and the photoresist layer 304 for the processes thereafter.

In the second embodiment of the present invention, the dielectric layer 300 at the predetermined position becomes a concave structure due to etching the certain depth thereof. Such concave structure attends to strengthen adhesion of the metal structure 302 to the dielectric layer 300 while it is formed thereon. During the step of forming the metal structure 302, the thickness of the metal structure 302 can also be tuned to be as high as the dielectric layer 300 to provide a total flat surface for the processes thereafter. Alternatively, the thickness of the metal structure 302 can also be tuned when forming in the middle between the dielectric layer 300 and the dielectric layer 307. Accordingly, a better stress balance when bending the multi-layer substrate can be obtained, so as to make a multi-layer substrate more flexible and less warped.

As shown in FIG. 4D, before the step of forming the metal structure 302, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the metal structure 302.

Figure 5A:
FIG. 5A to FIG. 5E depict a structural flow chart of a manufacturing method of a metal structure in a multi-layer substrate according to the third embodiment of the present invention.
Figure 5B:
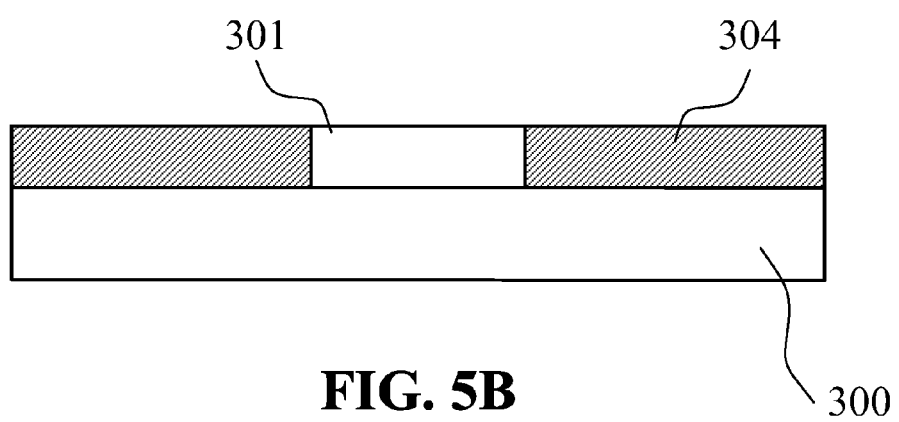
Figure 5C:
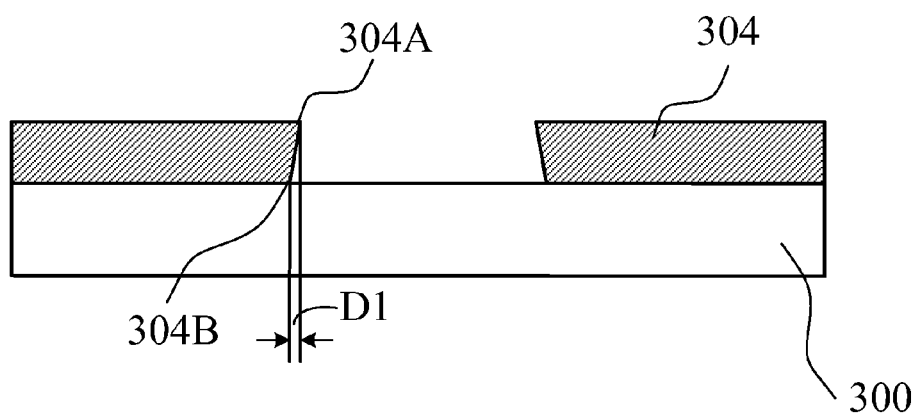
Figure 5D:
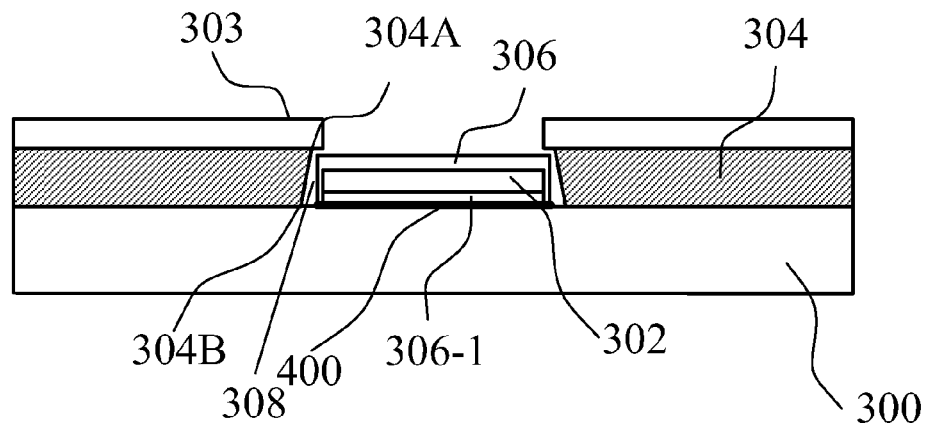
Figure 5E:
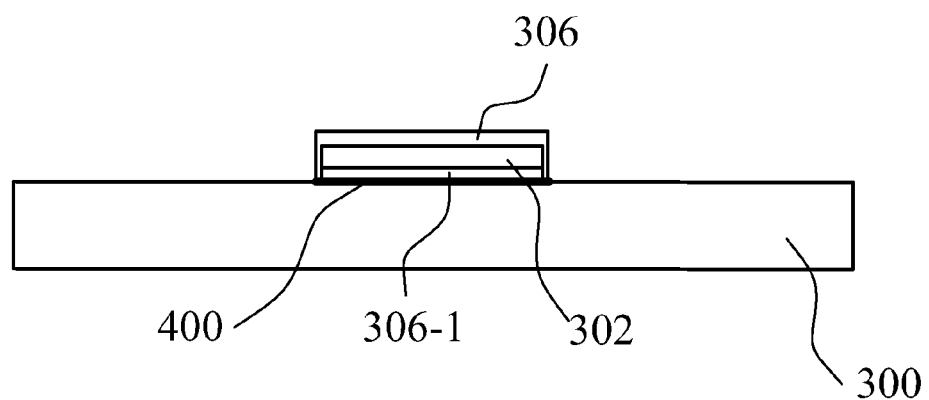

Please refer to FIG. 5A to FIG. 5E, which depict a structural flow chart of a manufacturing method of a metal structure in a multi-layer substrate according to the third embodiment of the present invention. The steps shown in FIG. 5A to FIG. 5C are the same as the steps shown in FIG. 3A to FIG. 3C. FIG. 5D shows steps of forming the under-cover metal layer 306-1, and then forming the metal structure 302 at the predetermined position (also forming a metal layer 303 on the photoresist layer 304), moreover, forming a top-cover metal layer 306 on the surface of the metal structure 302 to cover the metal structure 302 completely.

Furthermore, the manufacturing method of the present invention may comprise a step of forming an under-cover dielectric layer on the under-cover metal layer 306-1 after the step of forming under-cover metal layer 306-1 and a step of forming a top-cover dielectric layer on the metal structure 302 before the step of forming the top-cover metal layer 306 on a top surface and two side surfaces of the metal structure 302. Accordingly, the metal structure 302, the top-cover dielectric layer, the under-cover dielectric layer, the top-cover metal layer 306 and the under-cover metal layer 306-1 can be employed as a coaxial structure. The top-cover metal layer 306 and the under-cover metal layer 306-1 can be a metallic shield to transmit the high frequency signals.

Furthermore, the present invention can also replace the top-cover metal layer 306 and the under-cover metal layer 306-1 shown in FIG. 5D with a top-cover dielectric layer and an under-cover dielectric layer formed by a vacuum coating to provide a complete protection to the metal structure 302. As shown in FIG. 5D, before the step of forming the under-cover metal layer 306-1, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the under-cover metal layer 306-1.

Figure 6A:
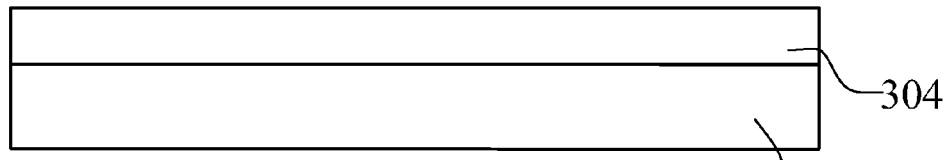
FIG. 6A to FIG. 6F depict a structural flow chart of a manufacturing method of a metal structure in a multi-layer substrate according to the fourth embodiment of the present invention.
Figure 6B:
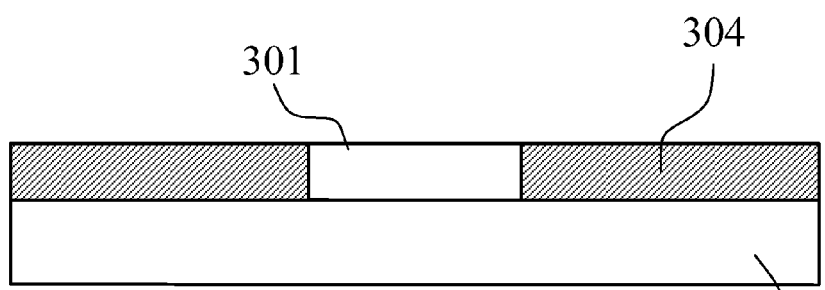
Figure 6C:
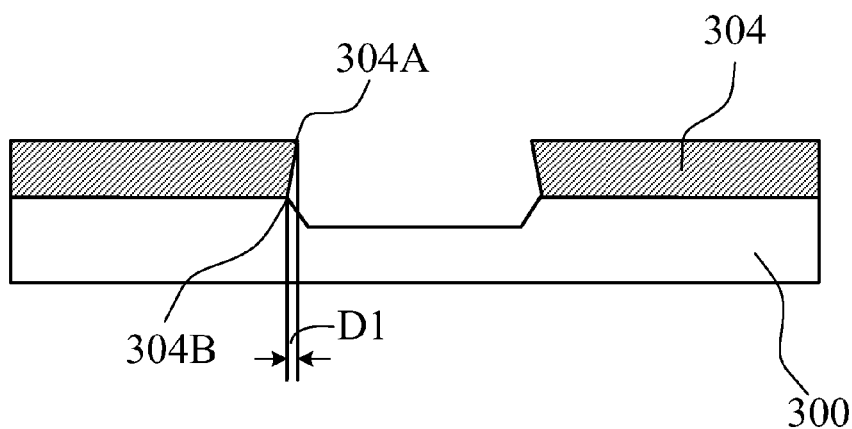
Figure 6D:
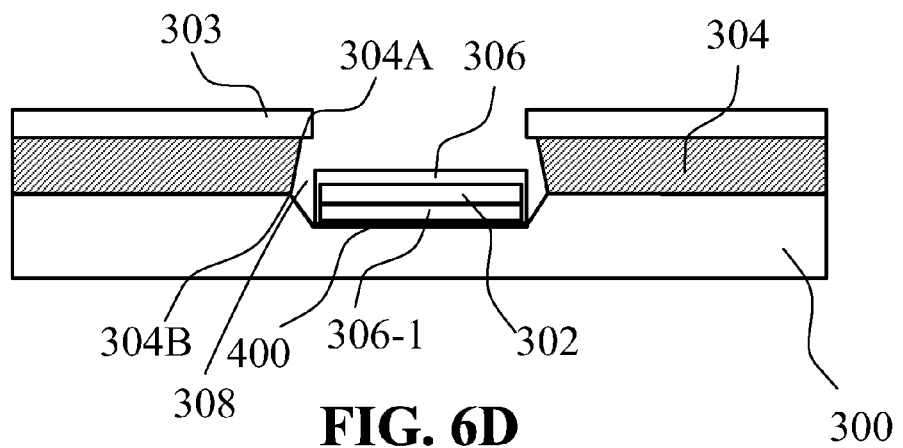
Figure 6E:
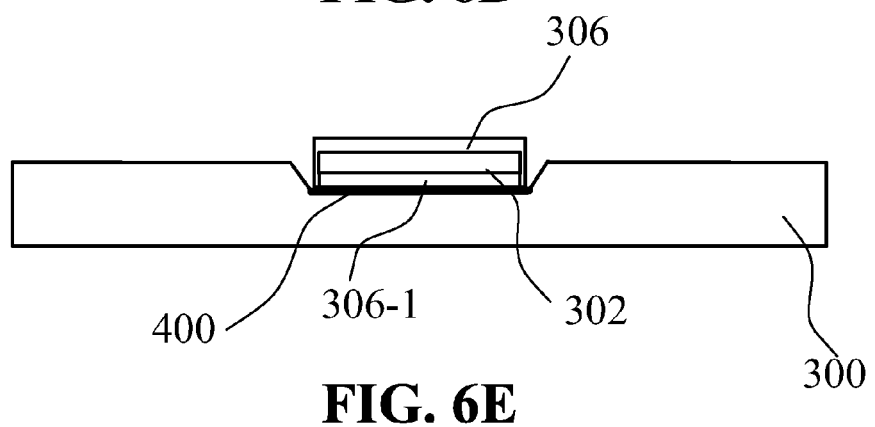
Figure 6F:
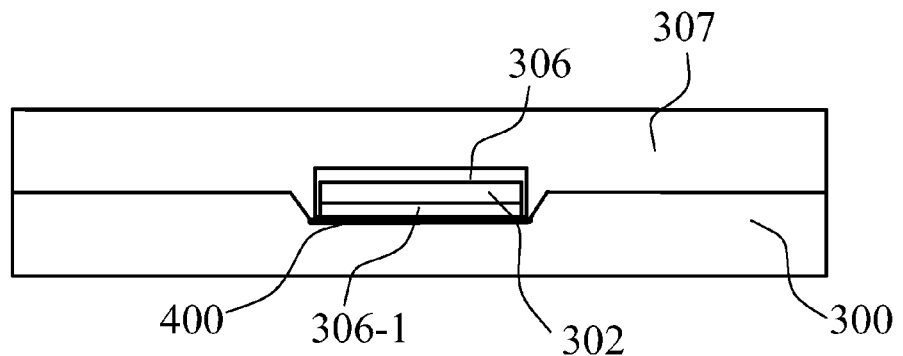

Please refer to FIG. 6A to FIG. 6F, which depict a structural flow chart of a manufacturing method of a metal structure in a multi-layer substrate according to the fourth embodiment of the present invention. The steps shown in FIG. 6A to FIG. 6C are the same as the steps shown in FIG. 4A to FIG. 4C. FIG. 6D shows steps of forming the under-cover metal layer 306-1, and then forming the metal structure 302 at the predetermined position (also forming a metal layer 303 on the photoresist layer 304), moreover, forming a top-cover metal layer 306 on the surface of the metal structure 302 to cover the metal structure 302 completely.

Furthermore, the manufacturing method of the present invention may comprise a step of forming an under-cover dielectric layer on the under-cover metal layer 306-1 after the step of forming under-cover metal layer 306-1 and a step of forming a top-cover dielectric layer on the metal structure 302 before the step of forming the top-cover metal layer 306 on a top surface and two side surfaces of the metal structure 302. Accordingly, the metal structure 302, the top-cover dielectric layer, the under-cover dielectric layer, the top-cover metal layer 306 and the under-cover metal layer 306-1 can be employed as a coaxial structure. The top-cover metal layer 306 and the under-cover metal layer 306-1 can be a metallic shield to transmit the high frequency signals.

Furthermore, the present invention can also replace the top-cover metal layer 306 and the under-cover metal layer 306-1 shown in FIG. 6D with a top-cover dielectric layer and an under-cover dielectric layer formed by a vacuum coating to provide a complete protection to the metal structure 302. As shown in FIG. 6D, before the step of forming the under-cover metal layer 306-1, the manufacturing method of the present invention may comprise a step of implementing an interface adhesion enhancing process (such as a plasma treatment) on the surface 400 of the dielectric layer 300 at the predetermined position to increase adhesion intensity between the dielectric layer 300 and the under-cover metal layer 306-1.

In the fourth embodiment of the present invention, the dielectric layer 300 at the predetermined position becomes a concave structure due to etching the certain depth thereof. Such concave structure attends to strengthen adhesion of the metal structure 302 to the dielectric layer 300 while it is formed thereon. During the step of forming the metal structure 302, the thickness of the metal structure 302 can also be tuned to be as high as the dielectric layer 300 to provide a total flat surface for the processes thereafter. Alternatively, the thickness of the metal structure 302 can also be tuned when forming in the middle between the dielectric layer 300 and the dielectric layer 307. Accordingly, a better stress balance when bending the multi-layer substrate can be obtained, so as to make a multi-layer substrate more flexible and less warped.

In all embodiments of the present invention, the material of the dielectric layer 300 can be polyimide. The material of the metal structure 302 can be copper. The material of top-cover metal layer 306 and the under-cover metal layer 306-1 can be chromium, titanium, gold, platinum or nickel. The interface adhesion enhancing process can be a plasma process.

Preferredly, the photoresist layer 304 is an organic photoresist layer in all embodiments of the present invention. When the photoresist layer 304 is an organic photoresist layer, an outgassing phenomenon occurs during the process of forming the top-cover metal layer 306 by the vacuum coating. The outgassing phenomenon causes the atoms of the material used for forming the top-cover metal layer 306 to collide the surface between the top 304A and the bottom 304B of the edge more rapidly. As a result, the effect of forming the top-cover metal layer 306 can be better.

Specifically, the manufacturing method of the present invention not only can form a top-cover metal layer 306 covering the top surface of the metal structure 302, but also can form the top-cover metal layer 306 covering the two side surfaces of the metal structure 302 at the same time. It prevents the metal structure 302 from corrosion or contamination, so as to raise the reliability of the metal structure. If a top-cover dielectric layer and an under-cover dielectric layer are formed between the metal structure 302 and the top-cover, under-cover metal layers 306, 306-1, accordingly, a coaxial structure can be realized.

In conclusion, in comparison with prior arts, the metal structure of the present invention is not manufactured by an etching method, therefore will not be limited by the size of the metal grain. The surface of the metal structure is fine, smooth straight but no roughness happens thereon. The present invention can form a top cover metal layer 306 covering the top surface and the two side surfaces, even an under-cover metal layer 306-1 covering the under surface of the metal structure by one single photomask. While the size of the metal structure 302 gets smaller continuously with miniaturization of integrated circuits in the multi-layer substrate, the present invention still can satisfy the demand for the finer metal structure 302 and can provide a simpler manufacturing process than prior arts to raise the reliability and yield to the multi-layer substrate.

Furthermore, the manufacturing method of the present invention is capable of forming the top-cover metal layer 306 to cover the two side surfaces of the metal structure 302 only when the edge of the photoresist layer 304 adjacent to the predetermined position is undercutted by the horizontal distance D1 of at least approximately 0.1 μm between the top 304A and the bottom 304B of the edge and more preferably by the horizontal distance D1 within 0.3 μm and 1 μm.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A manufacturing method of a metal structure in a multi-layer substrate, comprising steps of:
    coating at least one photoresist layer on a surface of a dielectric layer;
    exposing the photoresist layer to define a predetermined position of the metal structure;
    removing the photoresist layer at the predetermined position to undercut an edge of the photoresist layer adjacent to the predetermined position by a horizontal distance of at least 0.1 μm between a top and a bottom of the edge;
    forming the metal structure at the predetermined position; and
    forming at least one top-cover metal layer to cover a top surface and two side surfaces of the metal structure, wherein the edge of the photoresist layer adjacent to the predetermined position is undercutted, so that atoms in material used for forming the top-cover metal layer collide the surface between the top and the bottom of the edge and then rebound to the corresponding side surface of the metal structure during the step of forming the top-cover metal layer.

2. The manufacturing method of claim 1, wherein the edge of the photoresist layer adjacent to the predetermined position is undercutted by a horizontal distance of 0.3 μm to 1 μm.

3. The manufacturing method of claim 1, wherein the step of forming the top-cover metal layer to cover the top surface and the two side surfaces of the metal structure is implemented by a vacuum coating at a pressure of at least $1 \times 10^{-8}$ mbar.

4. The manufacturing method of claim 1, further comprising a step of forming an under-cover metal layer at the predetermined position before the step of forming the metal structure.

5. The manufacturing method of claim 4, wherein the under-cover metal layer covers an under surface of the metal structure.

6. The manufacturing method of claim 4, further comprising a step of forming an under-cover dielectric layer on the under-cover metal layer after the step of forming under-cover metal layer.

7. The manufacturing method of claim 6, further comprising a step of forming a top-cover dielectric layer on the surface of the metal layer before the step of forming the top-cover metal layer using as a coaxial structure.

8. The manufacturing method of claim 7, wherein the top-cover dielectric layer and the under-cover dielectric layer covers a top surface, two side surfaces and an under surface of the metal structure.

9. The manufacturing method of claim 1, wherein the photoresist layer is an organic photoresist layer.

10. The manufacturing method of claim 1, wherein the material of the dielectric layer is polyimide.

11. The manufacturing method of claim 1, wherein the material of the metal structure is copper.

12. The manufacturing method of claim 1, wherein the material of top-cover metal layer is selected from chromium, titanium, gold, platinum and nickel.

13. The manufacturing method of claim 1, further comprising a step of implementing an interface adhesion enhancing process on a surface of the dielectric layer at the predetermined position before the step of forming the metal structure.

14. The manufacturing method of claim 1, further comprising a step of removing a portion of the dielectric layer at the predetermined position after the step of removing the photoresist layer.

15. The manufacturing method of claim 14, further comprising a step of implementing an interface adhesion enhancing process on the surface of the dielectric layer before the step of forming the metal structure.

16. A manufacturing method of a metal structure in a multi-layer substrate, comprising steps of:
    coating at least one photoresist layer on a surface of a dielectric layer;
    exposing the photoresist layer to define a predetermined position of the metal structure;
    removing the photoresist layer at the predetermined position to undercut an edge of the photoresist layer adjacent to the predetermined position by a horizontal distance of at least 0.1 μm between a top and a bottom of the edge;
    forming the metal structure at the predetermined position; and
    forming at least one top-cover dielectric layer to cover a top surface and two side surfaces of the metal structure, wherein the edge of the photoresist layer adjacent to the predetermined position is undercutted, so that atoms in material used for forming the top-cover dielectric layer collide the surface between the top and the bottom of the edge and then rebound to the corresponding side surface of the metal structure during the step of forming the top-cover dielectric layer.

17. The manufacturing method of claim 16, wherein the edge of the photoresist layer adjacent to the predetermined position is undercutted by a horizontal distance of 0.3 μm to 1 μm.

18. The manufacturing method of claim 16, wherein the step of forming the top-cover dielectric layer to cover the top surface and the two side surfaces of the metal structure is implemented by a vacuum coating at a pressure of at least $1 \times 10^{-8}$ mbar.

19. The manufacturing method of claim 16, further comprising a step of forming an under-cover dielectric layer at the predetermined position before the step of forming the metal structure.

20. The manufacturing method of claim 19, wherein the under-cover dielectric layer covers an under surface of the metal structure.

21. The manufacturing method of claim 16, wherein the photoresist layer is an organic photoresist layer.

* * * * *